United States Patent
Li

(10) Patent No.: US 10,243,082 B2
(45) Date of Patent: Mar. 26, 2019

(54) THIN-FILM TRANSISTOR ARRAY PANEL HAVING THIN-FILM TRANSISTORS WITH CORROSIVENESS RESISTANCE

(71) Applicant: SHENZHEN CHINA STAR OPTOELECTRONICS TECHNOLOGY CO., LTD., Shenzhen, Guangdong (CN)

(72) Inventor: Shan Li, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 52 days.

(21) Appl. No.: 15/121,917

(22) PCT Filed: Apr. 22, 2016

(86) PCT No.: PCT/CN2016/080028
§ 371 (c)(1),
(2) Date: Aug. 26, 2016

(87) PCT Pub. No.: WO2017/166343
PCT Pub. Date: Oct. 5, 2017

(65) Prior Publication Data
US 2018/0151741 A1    May 31, 2018

(30) Foreign Application Priority Data
Mar. 30, 2016 (CN) .......................... 2016 1 0190504

(51) Int. Cl.
H01L 29/786    (2006.01)
H01L 21/02    (2006.01)
H01L 21/44    (2006.01)
H01L 21/4763    (2006.01)
H01L 27/12    (2006.01)
(Continued)

(52) U.S. Cl.
CPC ...... *H01L 29/7869* (2013.01); *H01L 21/0257* (2013.01); *H01L 21/02565* (2013.01); *H01L 21/02631* (2013.01); *H01L 21/44* (2013.01); *H01L 21/47635* (2013.01); *H01L 27/124* (2013.01); *H01L 27/1225* (2013.01); *H01L 29/24* (2013.01); *H01L 29/45* (2013.01); *H01L 29/4908* (2013.01)

(58) Field of Classification Search
CPC .......... H01L 29/66765; H01L 29/4908; H01L 29/7869
See application file for complete search history.

(56) References Cited

U.S. PATENT DOCUMENTS

| | | |
|---|---|---|
| 7,420,213 B2 | 9/2008 | Chae et al. |
| 2013/0119324 A1 | 5/2013 | Morita |
| 2016/0276486 A1* | 9/2016 | Koezuka ............. H01L 29/7869 |

FOREIGN PATENT DOCUMENTS

| | | |
|---|---|---|
| CN | 1983606 A | 6/2007 |
| CN | 103311130 A | 9/2013 |

* cited by examiner

Primary Examiner — Quoc Hoang
(74) Attorney, Agent, or Firm — Ladas & Parry LLP

(57) ABSTRACT

The present invention disclosure proposes a TFT array panel includes a back-channel etching structure TFT having a semiconductor layer made from a tin-silicon oxide, a source, and a drain. Both of the source and the drain are arranged on and contact the semiconductor layer. The present disclosure effectively promotes the electron mobility of the semiconductor layer

20 Claims, 2 Drawing Sheets

(51) Int. Cl.
*H01L 29/24* (2006.01)
*H01L 29/45* (2006.01)
*H01L 29/49* (2006.01)

THIN-FILM TRANSISTOR ARRAY PANEL HAVING THIN-FILM TRANSISTORS WITH CORROSIVENESS RESISTANCE

BACKGROUND OF THE INVENTION

1. Field of the Invention

The present invention relates to the field of display, and more particularly, to a thin-film transistor (TFT) array panel.

2. Description of the Prior Art

A conventional display panel comprises a TFT. The TFT usually has a back-channel etching structure or an etching block structure.

Practically, the conventional technology has two problems as follows:

When a source and a drain are etched on a semiconductor layer in the TFT having the back-channel etching structure with either the dry etching method or the wet etching method, the back-channel of the EFT is bound to be damaged.

Specifically, the semiconductor layer is vulnerable to ions using the dry etching method so carrier traps occur on the exposed surface of the channel easily. The concentration of oxygen cavity increases as well. All in all, the stability of the TFT gets much worse.

The semiconductor layer is sensitive to most acid etching solutions, so the semiconductor layer is inclined to be corroded with the wet-etching method. Further, the performance of the TFT is negatively affected.

Therefore, it is necessary to propose a new technique to solve the above-mentioned technical problem.

SUMMARY OF THE INVENTION

An object of the present invention is to propose a TFT array panel. The TFT array panel comprises a semiconductor layer arranged in the TFT with more corrosiveness resistance. Further, the semiconductor layer can effectively protect the back-channel in the TFT from being damaged, thereby enhancing the stability of the TFT to the utmost.

In one aspect of the present disclosure, a thin-film transistor (TFT) array panel comprises a substrate, a scanning line, a TFT with a back-channel etching structure, an insulating layer, a data line, and an electrode layer. The TFT includes a gate, a semiconductor layer made from a tin-silicon oxide, a source arranged on and contacting the semiconductor layer, and a drain, arranged on and contacting the semiconductor layer. The insulating layer is arranged between the gate and the semiconductor. The data line is connected to the source. The electrode layer is connected to the drain. The scanning line and/or the gate are/is layered and formed by a combination of a first metallic layer, a second layer, and a third metallic layer. The first metallic layer corresponds to molybdenum (Mo), the second metallic layer corresponds to aluminum (Al), and the third metallic layer corresponds to molybdenum. A metallic layer which the source and the drain correspond to is a fourth metallic layer, and the fourth metallic layer corresponds to molybdenum.

In at least one embodiment, the semiconductor material is further doped with nitrogen. the semiconductor material comprises an element of $Si_xSn_{(1-x)}O_{(2-y)}N_z$, $0.001 \leq x \leq 0.15$ holds, $y > 0$ holds, and $0 \leq z \leq 0.01$ holds.

In at least one embodiment, during the process of fabricating a target with silicon dioxide and stannic oxide materials, nitrogen is mixed with silicon nitride material and doped into the semiconductor material; and/or during the process of sputtering the target comprising the silicon dioxide and stannic oxide materials onto the semiconductor layer, a gas comprising nitrogen is injected and doped into the semiconductor material.

In another aspect of the present invention, a thin-film transistor (TFT) array panel comprises a substrate, a scanning line, a TFT with a back-channel etching structure, an insulating layer, a data line, and an electrode layer. The TFT includes a gate, a semiconductor layer made from a tin-silicon oxide, a source arranged on and contacting the semiconductor layer, and a drain, arranged on and contacting the semiconductor layer. The insulating layer is arranged between the gate and the semiconductor. The data line is connected to the source. The electrode layer is connected to the drain.

In at least one embodiment, the semiconductor material is further doped with nitrogen (N). The semiconductor material comprises an element of $Si_xSn_{(1-x)}O_{(2-y)}N_z$, $0.001 \leq x \leq 0.15$ holds, $y > 0$ holds, and $0 \leq z \leq 0.01$ holds.

In at least one embodiment, during the process of fabricating a target with silicon dioxide ($SiO_2$) and stannic oxide ($SnO_2$) materials, nitrogen is mixed with silicon nitride ($Si_3N_4$) material and doped into the semiconductor material; and/or during the process of sputtering the target comprising the silicon dioxide ($SiO_2$) and stannic oxide ($SnO_2$) materials onto the semiconductor layer, a gas comprising nitrogen is injected and doped into the semiconductor material.

In at least one embodiment, $10^{-15} \leq z \leq 10^{-5}$ holds.

In at least one embodiment, upon a condition that x is equal to 0.001, and $z=10^{-15}$ holds, the stannic oxide and silicon dioxide materials are mixed according to a first default ratio to form a first target, and the first target where argon, oxygen, and nitrogen are injected is sputtered onto the insulating layer for forming the semiconductor layer.

In at least one embodiment, upon a condition that x is equal to 0.05, and $z=10^{-15}$ holds, the stannic oxide, silicon dioxide, and silicon nitride materials are mixed according to a second default ratio to form a second target, and the second target where argon and oxygen are injected is sputtered onto the insulating layer for forming the semiconductor layer.

In at least one embodiment, upon a condition that x is equal to 0.15, and z is equal to zero, the stannic oxide and silicon dioxide materials are mixed according to a third default ratio to form a third target, and the third target where argon and oxygen are injected is sputtered onto the insulating layer for forming the semiconductor layer.

In at least one embodiment, during the process of etching the metallic layer arranged on the semiconductor layer using any one of sulfuric acid, hydrochloric acid, and a metal etching solution for forming the source and the drain, the semiconductor layer is etched by the sulfuric acid, the hydrochloric acid, or the metal etching solution arbitrarily at a rate of smaller than or equal to 10 nanometers (nm) per minute (min).

In at least one embodiment, during the process of etching the metallic layer on the semiconductor layer using the metal etching solution for forming the source and the drain, the semiconductor layer is etched by the metal etching solution at the rate of smaller than or equal to 5 nanometers per minute.

In at least one embodiment, the metal etching solution is a mixture of nitric acid, acetic acid, and phosphoric acid, the nitric acid occupies 5% of the mixture, the acetic acid occupies 10% of the mixture, and the phosphoric acid occupies 70% of the mixture.

In at least one embodiment, the concentration range of the sulfuric acid is between 70% to 96%, and the concentration range of the hydrochloric acid is between 30% to 38%.

In at least one embodiment, the semiconductor layer is etched using hydrofluoric acid with a concentration ranging from 0.5% to 51% for being patterned.

In at least one embodiment, the scanning line and/or the gate are/is layered and formed by a combination of a first metallic layer, a second layer, and a third metallic layer. The first metallic layer corresponds to molybdenum (Mo), the second metallic layer corresponds to aluminum (Al), and the third metallic layer corresponds to molybdenum.

In at least one embodiment, the thickness of the first metallic layer is 25 nanometers, the thickness of the second metallic layer is 100 nanometers, and the thickness of the third metallic layer is 25 nanometers.

In at least one embodiment, a metallic layer which the source and the drain correspond to is a fourth metallic layer, and the fourth metallic layer corresponds to molybdenum.

In at least one embodiment, the thickness of the fourth metallic layer is 300 nanometers.

In at least one embodiment, the thickness of the semiconductor layer ranges from 10 nanometers to 200 nanometers.

Compared with the conventional technology, the semiconductor layer arranged in the TFT is more corrosiveness resistance in the present invention. So the semiconductor layer can effectively protect the back-channel in the TFT from being damaged, thereby enhancing the stability of the TFT to the utmost.

These and other features, aspects and advantages of the present disclosure will become understood with reference to the following description, appended claims and accompanying figures.

DETAILED DESCRIPTION OF THE PREFERRED EMBODIMENTS

The terminology used herein is for the purpose of describing particular embodiments only and is not intended to be limiting of the invention. As used herein, the singular forms "a", "an" and "the" are intended to include the plural forms as well, unless the context clearly indicates otherwise.

A thin-film transistor (TFT) array panel proposed by the present invention can be applied to a display panel. The display panel may be a thin-film transistor liquid crystal display (TFT-LCD), an organic light emitting diode (OLED), etc.

The TFT array panel proposed by the present invention may be an array panel adopted by a TFT-LCD. Under the circumstances, an electrode layer 107 in the TFT array panel may be a stripe-shaped electrode. Also, the TFT array panel is used in the TFT-LCD panel comprising a liquid crystal layer and a color filter array panel.

The TFT array panel proposed by the present invention may be also an array panel used in an OLED display panel. Under the circumstances, the electrode layer 107 in the TFT array panel may be a cathode layer. Also, the TFT array panel is used in the OLED display panel comprising an organic emitting material layer and an anode layer.

Figure 1:
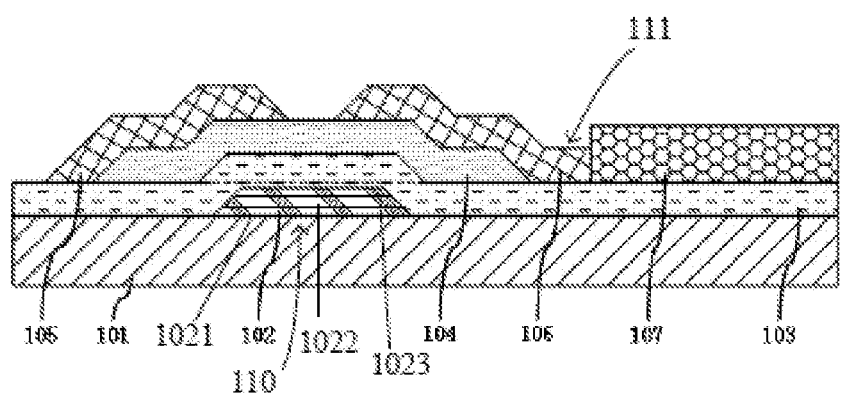
FIG. 1 shows a schematic diagram of a TFT array panel according to a first embodiment of the present invention.

Please refer to FIG. 1 showing a schematic diagram of a TFT array panel according to a first embodiment of the present invention.

The TFT array panel comprises a substrate 101, a scanning line, a TFT, an insulating layer 103, a data line, and an electrode layer 107.

The TFT has a back-channel etching structure. The TFT comprises a gate 102, a semiconductor layer 104, a source 105, and a drain 106. The semiconductor material for the semiconductor layer 104 is a tin-silicon oxide. In the back-channel etching structure, the source 105 and the drain 106 are both arranged on the semiconductor layer 104, and each of the source 105 and the drain 106 contacts the semiconductor layer 104.

The insulating layer 103 is arranged between the gate 102 and the semiconductor layer 104. The data line is connected to the source 105. The electrode layer 107 is connected to the drain 106.

For the TFT array panel proposed by this embodiment, the semiconductor material is the tin-silicon oxide. In other words, tin is substituted for partial silicon in silica. Silicon and tin both are quadrivalence so the substitution does not generate unnecessary electrons and the free carrier concentration is prohibited. Meanwhile, the electron orbit of silicon is simpler so not much energy level splitting occurs, which is good for preventing faults and enhancing electron mobility. In addition, the etching ratio of the semiconductor layer 104 in acid is adjusted. While the content of silicon grows, the etching ratio of the semiconductor layer 104 in acid decreases.

For the TFT array panel proposed by this embodiment, the semiconductor material is doped with nitrogen (N) further. The semiconductor material comprises an element of $Si_xSn_{(1-x)}O_{(2-y)}N_z$ where $0.001 \leq x \leq 0.15$, $y>0$, and $0 \leq z \leq 0.01$ all hold, and specifically, $y>0$ and $y \leq 2$ both hold.

During the process of fabricating a target with the silicon dioxide ($SiO_2$) and stannic oxide ($SnO_2$) materials, nitrogen is mixed with the silicon nitride ($Si_3N_4$) material and doped into the semiconductor material; and/or:

During the process of sputtering the target comprising the silicon dioxide ($SiO_2$) and stannic oxide ($SnO_2$) materials onto the insulating layer 103, a gas comprising nitrogen is injected and doped into the semiconductor material.

Nitrogen is used to enhance the stability of the TFT.

For the TFT array panel proposed by this embodiment, $10^{-15} \leq z \leq 10^{-5}$ holds.

Figure 2:
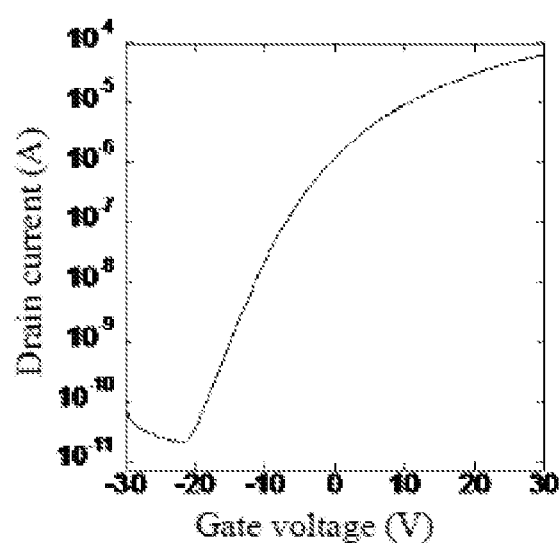
FIG. 2 shows a characteristic diagram of drain currents versus gate voltages of a thin film transistor according to a first embodiment of the present invention.

For the TFT array panel proposed by this embodiment, x is equal to 0.001 (x=0.001). The stannic oxide ($SnO_2$) and silicon dioxide ($SiO_2$) materials are mixed according to a first default ratio to form a first target. And then, the first target where argon (Ar), oxygen, and nitrogen are injected is sputtered onto the insulating layer 103 to form the semiconductor layer 104. z is equal to $10^{-15}$. The electron mobility of the TFT is 3.3 $cm^2/(V*S)$, so the electron mobility can increase more, as FIG. 2 shows.

For the TFT array panel proposed by this embodiment, during the process of etching a metallic layer arranged on the semiconductor layer 104 using any one of sulfuric acid ($H_2SO_4$), hydrochloric acid (HCl), and a metal etching solution to form the source 105 and a drain 106, the semiconductor layer 104 is etched by sulfuric acid, hydrochloric acid, or the metal etching solution arbitrarily at the rate of smaller than or equal to 10 nanometers (nm) per minute (min).

The concentration range of sulfuric acid is between 70% to 95%. The concentration range of hydrochloric acid is between 30% to 38%.

During the process of etching the metallic layer on the semiconductor layer 104 with the metal etching solution to form the source 105 and the drain 106, the semiconductor layer 104 is etched by the metal etching solution at the rate of smaller than or equal to five nanometers per minute.

The metal etching solution is a mixture of nitric acid ($HNO_3$), acetic acid ($CH_3COOH$), and phosphoric acid ($H_3PO_4$). The nitric acid occupies 5% of the mixture, the acetic acid occupies 10% of the mixture, and the phosphoric acid occupies 70% of the mixture.

In this embodiment, the content of silicon in the semiconductor material is manipulated to control the etching ratio of the semiconductor layer 104 in the metal etching solution. When the content of silicon is more, the etching ratio is less. When $0.001 \leq x \leq 0.15$ holds, the etching ratio of the semiconductor layer 104 in the metal etching solution ranges from 5 nanometers per minute to 0.02 nanometers per minute.

In this embodiment, the semiconductor layer 104 is etched using hydrofluoric acid (HF) with a concentration ranging from 0.5% to 51% to be patterned.

Preferably, the semiconductor layer 104 is etched using hydrofluoric acid with the concentration of 10% to be patterned.

For the TFT array panel proposed by this embodiment, the concentration of the carriers is smaller than $10^{17}$ $cm^3$.

Preferably, the concentration of the carriers is smaller than $10^{16}$ per cubic centimeter.

For the TFT array panel proposed by this embodiment, the scanning line and/or the gate 102 are/is layered and formed by the combination of the first metallic layer, the second metallic layer, and the third metallic layer. The first metallic layer corresponds to molybdenum (Mo). The second metallic layer corresponds to aluminum (Al). The third metallic layer corresponds to molybdenum. The thickness of the first metallic layer is twenty-five nm. The thickness of the second metallic layer is one hundred nm. The thickness of the third metallic layer is twenty-five nm. The first metallic layer, the second layer, and the third metallic layer are deposited using the physical vapor deposition (PVD) process.

The metallic layer which the source 105 and the drain 106 correspond to is a fourth metallic layer. The fourth metallic layer corresponds to molybdenum. The thickness of the fourth metallic layer is 300 nm.

For the TFT array panel proposed by this embodiment, the thickness of the semiconductor layer 104 ranges from 10 nm to 200 nm.

Figure 3:
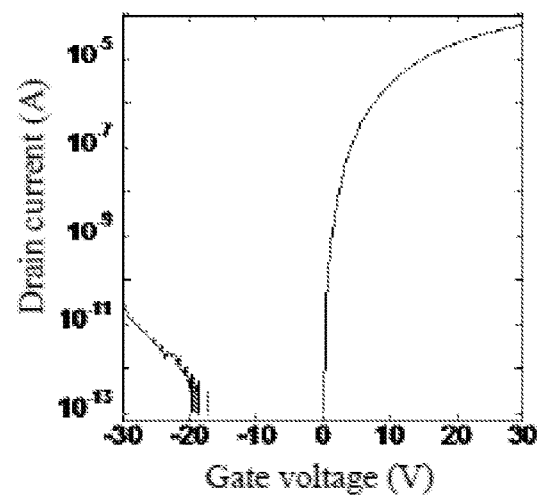
FIG. 3 shows a characteristic diagram of drain currents versus gate voltages of a thin film transistor according to a second embodiment of the present invention.

The TFT array panel proposed by the second embodiment is similar to the TFT array panel proposed by the first embodiment, except:

x is equal to 0.05 (x=0.05). The stannic oxide ($SnO_2$), silicon dioxide ($SiO_2$), and silicon nitride ($Si_3N_4$) materials are mixed according to a second default ratio to form a second target. And then, the second target where argon and oxygen are injected is sputtered onto the insulating layer 103 to form the semiconductor layer 104. z is equal to $10^{-15}$ ($z=10^{-15}$). The electron mobility of the TFT is 7.6 $cm^2/(V*S)$, so the electron mobility can increase more, as FIG. 3 shows.

Figure 4:
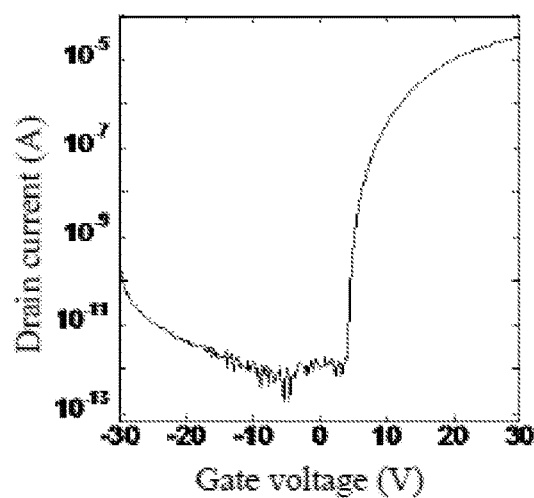
FIG. 4 shows a characteristic diagram of drain currents versus gate voltages of a thin film transistor according to a third embodiment of the present invention.

The TFT array panel proposed by the third embodiment is similar to the TFT array panel proposed by the first embodiment, except:

x is equal to 0.15 (x=0.15). The stannic oxide ($SnO_2$) and silicon dioxide ($SiO_2$) materials are mixed according to a third default ratio to form a third target. And then, the third target where argon and oxygen are injected is sputtered onto the insulating layer 103 to form the semiconductor layer 104. z is equal to zero (z=0), which implies that the semiconductor material is not doped with nitrogen. In this embodiment, the electron mobility of the semiconductor layer 104 is 2.6 $cm^2/(V*S)$, so the electron mobility can increase more, as FIG. 4 shows.

By using the present disclosure, the semiconductor layer 104 arranged in the TFT is more corrosiveness resistance. So the semiconductor layer can effectively protect the back-channel in the TFT from being damaged, thereby enhancing the stability of the TFT to the utmost.

The technique proposed by the present invention effectively promotes the electron mobility of the semiconductor layer 104.

Moreover, despite one or more implementations relative to the present disclosure being illustrated and described, equivalent alterations and modifications will occur to others skilled in the art upon reading and understanding this specification and the annexed drawings. The present disclosure comprises such modifications and variations, and is to be limited only by the terms of the appended claims. In particular, regarding the various functions performed by the above described components, the terms used to describe such components (i.e. elements, resources, etc.) are intended to correspond (unless otherwise indicated) to any component, which performs the specified function of the described component (i.e., that is, functionally equivalent), even though not structurally equivalent to the disclosed structure which performs the function in the illustrated implementations of the disclosure. In addition, although a particular feature of the disclosure may have been disclosed with respect to only one of several implementations, such a feature may be combined with one or more other features of the other implementations as may be desired and advantageous for any given or particular application. Also, to the extent that the terms "including", "includes", "having", "has", "with", or variants thereof are used in the detailed description or in the claims, such terms are intended to be inclusive in a manner similar to the term "comprising".

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A thin-film transistor (TFT) array panel, comprising:
    a substrate;
    a scanning line;
    a TFT with a back-channel etching structure, comprising:
        a gate;
        a semiconductor layer, made from a tin-silicon oxide;
        a source, arranged on and contacting the semiconductor layer; and
        a drain, arranged on and contacting the semiconductor layer;
        an insulating layer, arranged between the gate and the semiconductor;
    a data line, connected to the source; and an electrode layer, connected to the drain,
wherein the scanning line and/or the gate are/is layered and formed by a combination of a first metallic layer, a second layer, and a third metallic layer;
the first metallic layer corresponds to molybdenum (Mo), the second metallic layer corresponds to aluminum (Al), and the third metallic layer corresponds to molybdenum;
wherein a metallic layer which the source and the drain correspond to is a fourth metallic layer, and the fourth metallic layer corresponds to molybdenum.

2. The TFT array panel of claim 1, wherein the semiconductor material is further doped with nitrogen, the semiconductor material comprises an element of SixSn(1−x)O(2−y)Nz, 0.001≤x≤0.15 holds, y>0 holds, and 0≤z≤0.01 holds.

3. The TFT array panel of claim 2, wherein during the process of fabricating a target with silicon dioxide and stannic oxide materials, nitrogen is mixed with silicon nitride material and doped into the semiconductor material; and/or
during the process of sputtering the target comprising the silicon dioxide and stannic oxide materials onto the semiconductor layer, a gas comprising nitrogen is injected and doped into the semiconductor material.

4. A thin-film transistor (ITT) array panel, comprising:
a substrate;
a scanning line;
a TFT with a back-channel etching structure, comprising:
a gate;
a semiconductor layer, made from a tin-silicon oxide;
a source, arranged on and contacting the semiconductor layer; and
a drain, arranged on and contacting the semiconductor layer;
an insulating layer, arranged between the gate and the semiconductor layer;
a data line, connected to the source; and
an electrode layer, connected to the drain.

5. The TFT array panel of claim 4, wherein the semiconductor material is further doped with nitrogen(N), the semiconductor material comprises an element of SixSn(1−x)O(2−y)Nz, 0.001≤x≤0.15 holds, y>0 holds, and 0≤z≤0.01 holds.

6. The TFT array panel of claim 5, wherein during the process of fabricating a target with silicon dioxide (SiO2) and stannic oxide (SnO2) materials, nitrogen is mixed with silicon nitride(Si3N4) material and doped into the semiconductor material; and/or
during the process of sputtering the target comprising the silicon dioxide(SiO2) and stannic oxide (SnO2) materials onto the semiconductor layer, a gas comprising nitrogen is injected and doped into the semiconductor material.

7. The TFT array panel of claim 6, wherein 10-15≤z≤10-5 holds.

8. The TFT array panel of claim 7, wherein upon a condition that x is equal to 0.001, and z=10-15 holds, the stannic oxide and silicon dioxide materials are mixed according to a first default ratio to form a first target, and the first target where argon, oxygen, and nitrogen are injected is sputtered onto the insulating layer for forming the semiconductor layer.

9. The TFT array panel of claim 7, wherein upon a condition that x is equal to 0.05, and z=10-15 holds, the stannic oxide, silicon dioxide, and silicon nitride materials are mixed according to a second default ratio to form a second target, and the second target where argon and oxygen are injected is sputtered onto the insulating layer for forming the semiconductor layer.

10. The TFT array panel of claim 6, wherein upon a condition that x is equal to 0.15, and z is equal to zero, the stannic oxide and silicon dioxide materials are mixed according to a third default ratio to form a third target, and the third target where argon and oxygen are injected is sputtered onto the insulating layer for forming the semiconductor layer.

11. The TFT array panel of claim 4, wherein during the process of etching the metallic layer arranged on the semiconductor layer using any one of sulfuric acid, hydrochloric acid, and a metal etching solution for forming the source and the drain, the semiconductor layer is etched by the sulfuric acid, the hydrochloric acid, or the metal etching solution arbitrarily at a rate of smaller than or equal to 10 nanometers (nm) per minute(min).

12. The TFT array panel of claim 11, wherein during the process of etching the metallic layer on the semiconductor layer using the metal etching solution for forming the source and the drain, the semiconductor layer is etched by the metal etching solution at the rate of smaller than or equal to 5 nanometers per minute.

13. The TFT array panel of claim 11, wherein the metal etching solution is a mixture of nitric acid, acetic acid, and phosphoric acid, the nitric acid occupies 5% of the mixture, the acetic acid occupies 10% of the mixture, and the phosphoric acid occupies 70% of the mixture.

14. The TFT array panel of claim 11, wherein the concentration range of the sulfuric acid is between 70% to 96%, and the concentration range of the hydrochloric acid is between 30% to 38%.

15. The TFT array panel of claim 4, wherein the semiconductor layer is etched using hydrofluoric acid with a concentration ranging from 0.5% to 51% for being patterned.

16. The TFT array panel of claim 4, wherein the scanning line and/or the gate are/is layered and formed by a combination of a first metallic layer, a second layer, and a third metallic layer;
the first metallic layer corresponds to molybdenum (Mo), the second metallic layer corresponds to aluminum (Al), and the third metallic layer corresponds to molybdenum.

17. The TFT array panel of claim 16, wherein the thickness of the first metallic layer is 25 nanometers, the thickness of the second metallic layer is 100 nanometers, and the thickness of the third metallic layer is 25 nanometers.

18. The TFT array panel of claim 4, wherein a metallic layer which the source and the drain correspond to is a fourth metallic layer, and the fourth metallic layer corresponds to molybdenum.

19. The TFT array panel of claim 18, wherein the thickness of the fourth metallic layer is 300 nanometers.

20. The TFT array panel of claim 4, wherein the thickness of the semiconductor layer ranges from 10 nanometers to 200 nanometers.

* * * * *